United States Patent [19]
Furukawa et al.

[11] Patent Number: 5,256,890
[45] Date of Patent: Oct. 26, 1993

[54] NON-INTERLACING CHARGE COUPLED DEVICE OF A FRAME INTERLINE TRANSFER TYPE

[75] Inventors: Junichi Furukawa, Kagoshima; Hideo Kanbe, Kanagawa, both of Japan

[73] Assignee: Sony Corporation, Tokyo, Japan

[21] Appl. No.: 753,076

[22] Filed: Aug. 30, 1991

[30] Foreign Application Priority Data
Sep. 5, 1990 [JP] Japan .................... 2-235367

[51] Int. Cl.⁵ .............. H01L 29/78; H01L 27/14; H01L 31/00
[52] U.S. Cl. .................... 257/233; 257/249; 257/435
[58] Field of Search .......... 357/24 LR, 30 H; 257/233, 249, 435

[56] References Cited
U.S. PATENT DOCUMENTS
3,890,633  4/1971  Kosonocky .......... 357/24
4,689,687  8/1987  Koike et al. .......... 357/24 LR

FOREIGN PATENT DOCUMENTS
56-87378  7/1981  Japan .
60-38869  2/1985  Japan .......... 357/24 LR
63-275164  11/1988  Japan .

Primary Examiner—Rolf Hille
Assistant Examiner—Robert Limanek
Attorney, Agent, or Firm—Hill, Steadman & Simpson

[57] ABSTRACT

A charge coupled device (CCD) of a frame interline transfer type comprises a plurality of picture elements aligned in the vertical direction. Rows of aligned picture elements are arranged parallel and adjacent to each other. Polysilicon electrodes extending in the horizontal direction are arranged on a substrate covered with an insulating layer and used as electrodes for vertical transfer of signal charges. Metal wiring films extending in the vertical direction are arranged parallel and traverse the polysilicon electrodes covered with the insulating layer. The metal wiring films are used as electrodes for applying a clock pulse for vertical transfer of signal charges to the polysilicon electrodes. First, second and third openings are formed through the insulating layer such that the metal wiring films may contact the first, second and third polysilicon electrodes, respectively.

14 Claims, 7 Drawing Sheets

NON-INTERLACING CHARGE COUPLED DEVICE OF A FRAME INTERLINE TRANSFER TYPE

BACKGROUND OF THE INVENTION

1. Field of the Invention

This invention relates to a charge coupled device, and particularly to a charge coupled device (CCD) of a non-interlacing type which performs frame interline transfer (FIT).

2. Description of the Background Art

FIG. 9 depicts a conventional charge coupled device of a non-interlacing type. As illustrated in FIG. 9, the conventional charge coupled device includes first, second and third polysilicon electrodes 1, 2, and 3 and aluminum electrodes 4, 5 and 6. The polysilicon electrodes 1, 2 and 3 contact the aluminum electrodes 4, 5 and 6 at distal ends thereof, respectively. In FIG. 9, numeral 7 represents a picture element composed of a photodiode. FIG. 10 is a sectional view of the conventional charge coupled device, taken along line A-A in FIG. 9.

In such a structure of the conventional charge coupled device, a distance between the distal ends of the respective polysilicon electrodes, at which each polysilicon electrode contacts the corresponding aluminum electrode, is not short enough to effect high-speed transfer of signal charges. The conventional CCD using polysilicon electrodes cannot, therefore, transfer signal charges at high speed due to a high electrical resistance of polysilicon.

In order to overcome such drawbacks, there has been proposed a non-interlacing type charge coupled device which uses polysilicon electrodes coated with a low resistivity material, for instance tungsten. However, such a non-interlacing type CCD cannot perform frame interline transfer (FIT) which must be effected at a speed 40 to 100 times faster than that for interline transfer (IT). Such high-speed transfer cannot be realized by only reducing the resistance of the electrodes.

SUMMARY OF THE INVENTION

It is an object of the present invention to eliminate the aforementioned disadvantages and to provide a non-interlacing charge coupled device (CCD) which can perform frame interline transfer (FIT).

In order to accomplish this object, there is provided a noninterlacing charge coupled device of the FIT type which includes a plurality of picture elements aligned vertically. The vertically aligned picture elements are arranged in parallel rows adjacent to each other. The CCD further includes a plurality of polysilicon electrodes extending in the horizontal direction. The polysilicon electrodes are arranged on a surface of a substrate covered with an insulating layer and used as electrodes for vertical transfer of signal charges. A plurality of metal wiring films extending in the vertical direction are also arranged in parallel, traversing the polysilicon electrodes covered with the insulating layer. The metal wiring films are used as electrodes for applying a clock pulse for vertical transfer of signal charges to the polysilicon electrodes. A plurality of first openings are formed through the insulating layer such that the metal wiring films contact the first polysilicon electrodes. A plurality of second openings are formed through the insulating layer such that the metal wiring films contact the second polysilicon electrodes. Further, a plurality of third openings are formed through the insulating layer such that the metal wiring films contact the third polysilicon electrodes.

DESCRIPTION OF THE PREFERRED EMBODIMENTS

Figure 1:
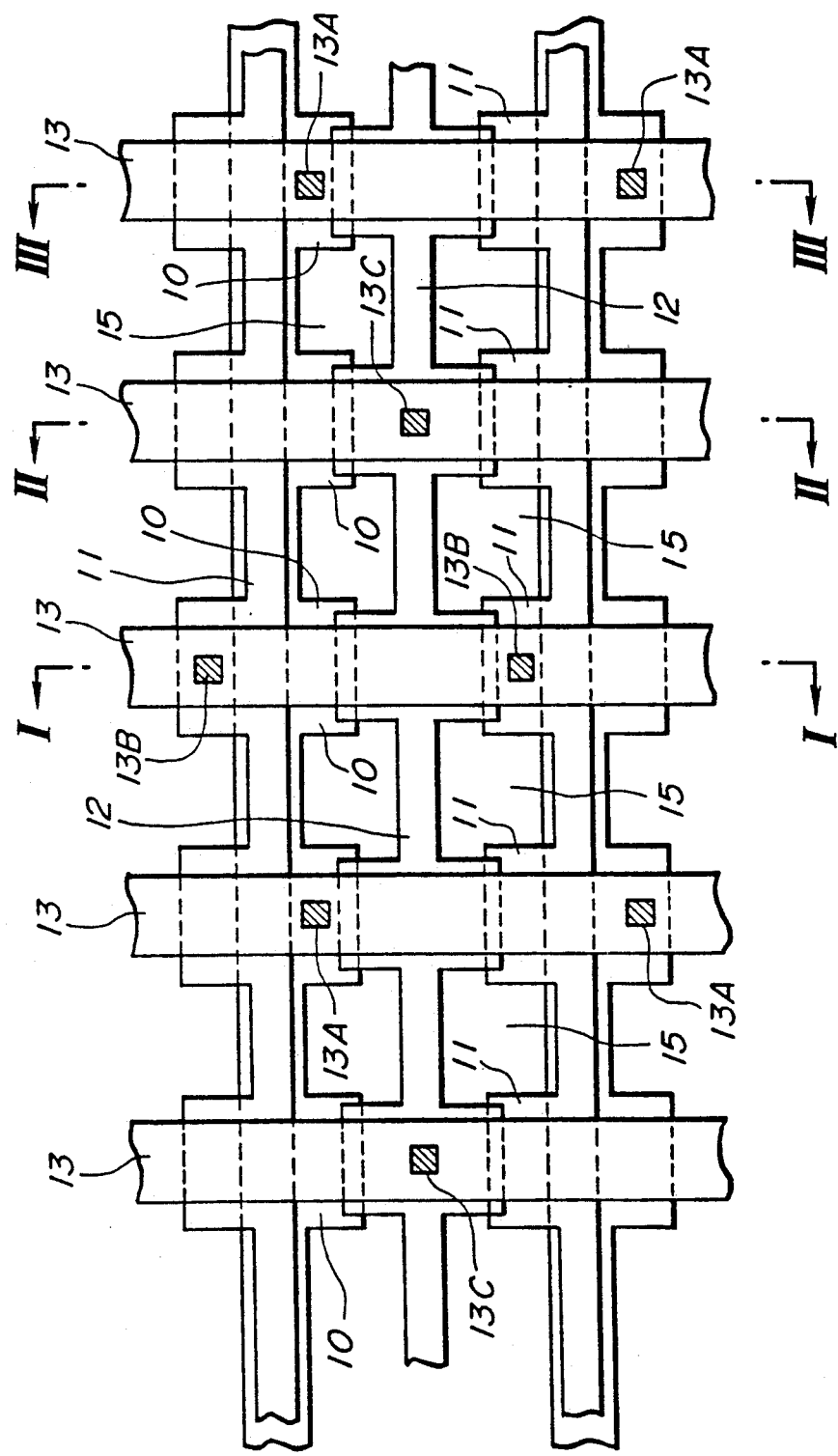
FIG. 1 is a plan view of a charge coupled device according to a first embodiment of the present invention.

The preferred embodiments of a non-interlacing type charge coupled device (CCD) according to the invention, which are suitable for frame interline transfer (FIT), will now be described with reference to the accompanying drawings.

Referring to FIGS. 1 to 4, a CCD according to the present invention includes first, second and third polysilicon electrodes 10, 11, 12 which are formed on a semiconductor substrate, such as silicon, and extend parallel to each other in the horizontal transfer direction (X-direction). The charge coupled device also includes a plurality of aluminum wiring films 13 which extend in the vertical transfer direction (Y-direction) perpendicular to the horizontal transfer direction. An insulating layer 14 made of silicon oxide is formed on a surface of a substrate 9 and fills spaces between the polysilicon electrodes 10, 11 and 12 and between the polysilicon electrodes 10, 11 and 12 and the aluminum wiring films 13, whereby the respective polysilicon electrodes 10, 11 and 12 and aluminum wiring films 13 are electrically separated from each other. The first polysilicon electrodes 10 are formed on the substrate 9 through the insulating layer 14 and arranged apart from and adjacent to each other. Each of the first polysilicon electrodes 10 has a plurality of rectangular tooth-like branched portions projecting from one side of a base portion thereof in the vertical transfer direction. Each of the second polysilicon electrodes 11 has a plurality of rectangular tooth-like branched portions projecting from one side of a base portion thereof in the vertical transfer direction so as to be opposite the branched portions of the first polysilicon electrode 10. The second polysilicon electrodes 11 are formed on the substrate 9 such that the base portion of the electrode 11 partially extends over the base portion of the electrode 10, where the parts of both electrodes overlap each other through the insulating layer 14. The third polysilicon electrode 12 has rectangular branched portions projecting in the vertical transfer direction from the opposite sides of a base portion thereof and formed on the substrate 9 such that end portions of the branched portions are partially extended over the branched portions of the electrodes 10 and 11 covered with the insulating layer 14. The aluminum wiring films 13 are formed as an uppermost layer and extend over the partially overlapped base portions of the electrodes 10 and 11 and the respective branched portions of the electrodes 10, 11 and 12 so that the vertical transfer lines of the charge coupled device extend along the aluminum wiring films 13. Thus, the aluminum wiring films 13 cover each vertical transfer line to thereby prevent the same from being exposed to incident light. In addition, the aluminum wiring films 13 serve as an electrode for applying clock pulses through the polysilicon electrodes 10, 11 and 12 to the substrate on the vertical transfer line. Upon application of the clock pulses, signal charges generated at a p-n junction photodiode of a picture element 15 are transmitted via the vertical transfer line. The polysilicon electrodes 10, 11 and 12 are contacted with the overlaid aluminum wiring films 13 through contact portions 13A, 13B and 13C which contact respective electrodes through openings formed in the insulating layer 14.

As shown in FIG. 1, the first polysilicon layer 10 is connected to the aluminum wiring films 13 through the contact portions 13A, 13A, while the second and third polysilicon layer 11 and 12 are connected to the aluminum wiring films 13 through the contact portions 13B, 13B and the contact portions 13C, 13C, respectively. Namely, the contact portions 13A, 13A, the contact portions 13B, 13B and the contact portions 13C, 13C are respectively arranged along the vertical transfer lines to thereby form separate vertical rows. Each row of aligned contact portions 13A, 13B and 13C appears under every third aluminum wiring film 13 extending along the vertical transfer lines. As is apparent from the drawing, the contact portions 13A, 13A are formed such that all the underlaid first polysilicon electrodes 10 are allowed to be in contact with the corresponding aluminum wiring film 13. The contact portions 13B, 13B and the contact portions 13C, 13C are provided in the same manner as the contact portions 13A, 13A. One end of the contact portions 13A, 13A is terminated at the branched portion of the first polysilicon electrode 10 where the connection between the aluminum wiring film 13 and the electrode 10 is created. The contact portions 13B, 13B are also formed through the insulating layer 14 so that the branched portions of the second polysilicon electrodes 11 are connected to the aluminum wiring film 13 while the contact portions 13C, 13C serve as connections between the base portion of the third polysilicon electrode 12 and the aluminum wiring films 13.

Figure 2:
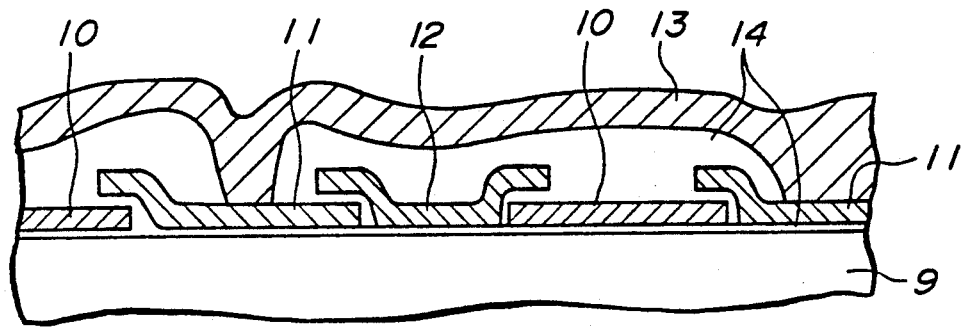
FIG. 2 is a sectional view of the charge coupled device taken along ling I—I of FIG. 1.
Figure 3:
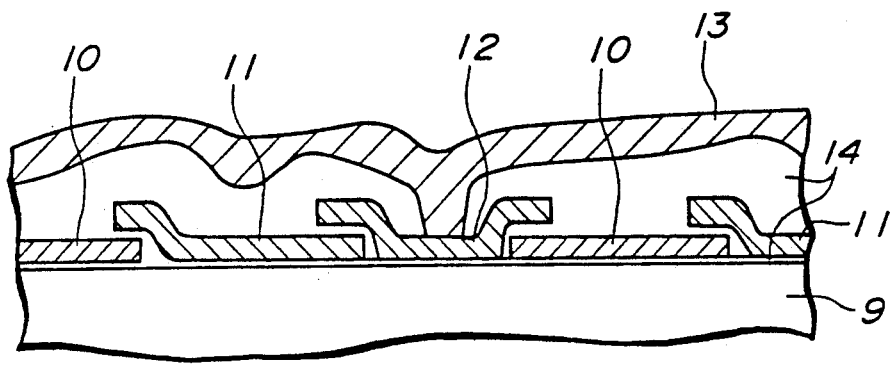
FIG. 3 is a sectional view of the charge coupled device taken along line II—II of FIG. 1.
Figure 4:
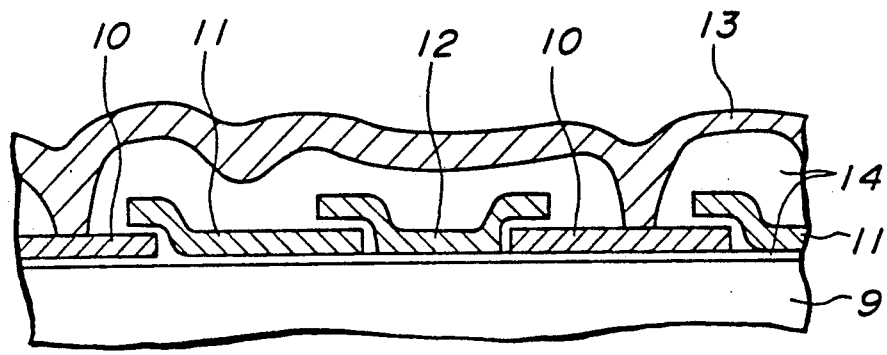
FIG. 4 is a sectional view of the charge coupled device taken along line III—III of FIG. 1.

As illustrated in FIGS. 2 to 4, the third polysilicon electrode 12 is designed such that only a small end area of each branched portion is overlapped with the corresponding end of the branched portion of each of the first and second polysilicon electrodes 10 and 11. To this end, the contact portions 13A, 13B and 13C having large sectional areas can be formed through the insulating film 14 whereby connection between the aluminum wiring films 13 and the first, second and third polysilicon electrodes 10, 11 and 12 is considerably facilitated.

A charge coupled device according to a second embodiment of the present invention will be described with reference to the accompanying drawings, in which like numerals indicate like parts of the CCD of the above described first embodiment.

Figure 5:
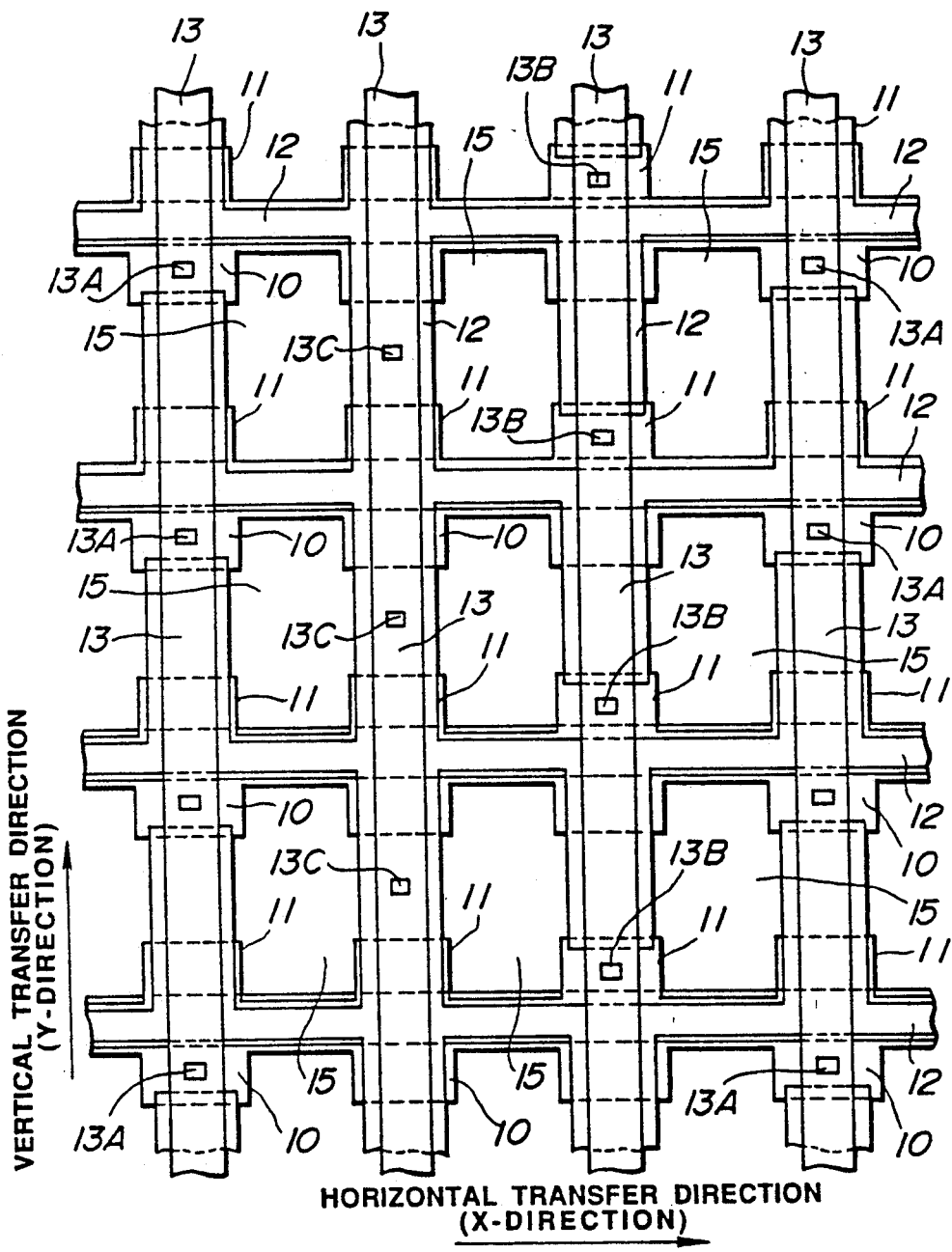
FIG. 5 is a plan view of a charge coupled device according to a second embodiment of the present invention.
Figure 6:
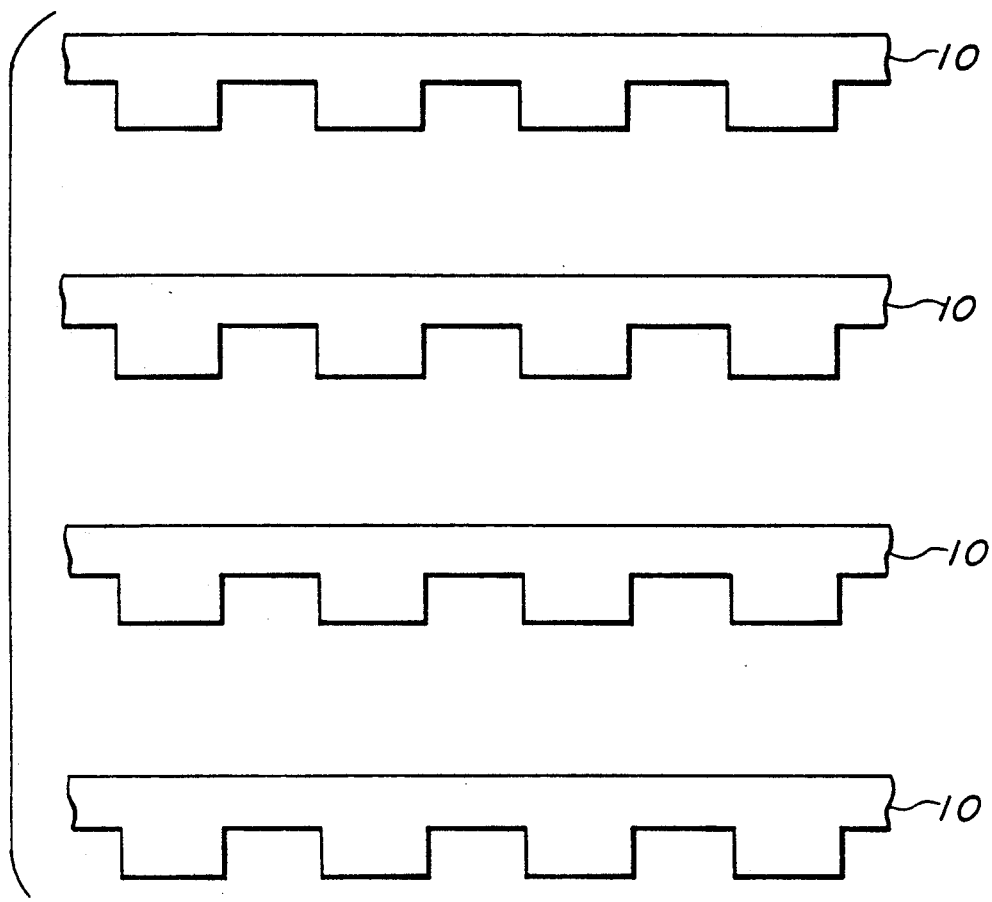
FIG. 6 is a plan view of the first polysilicon electrodes used in the charge coupled device of the second embodiment.
Figure 7:
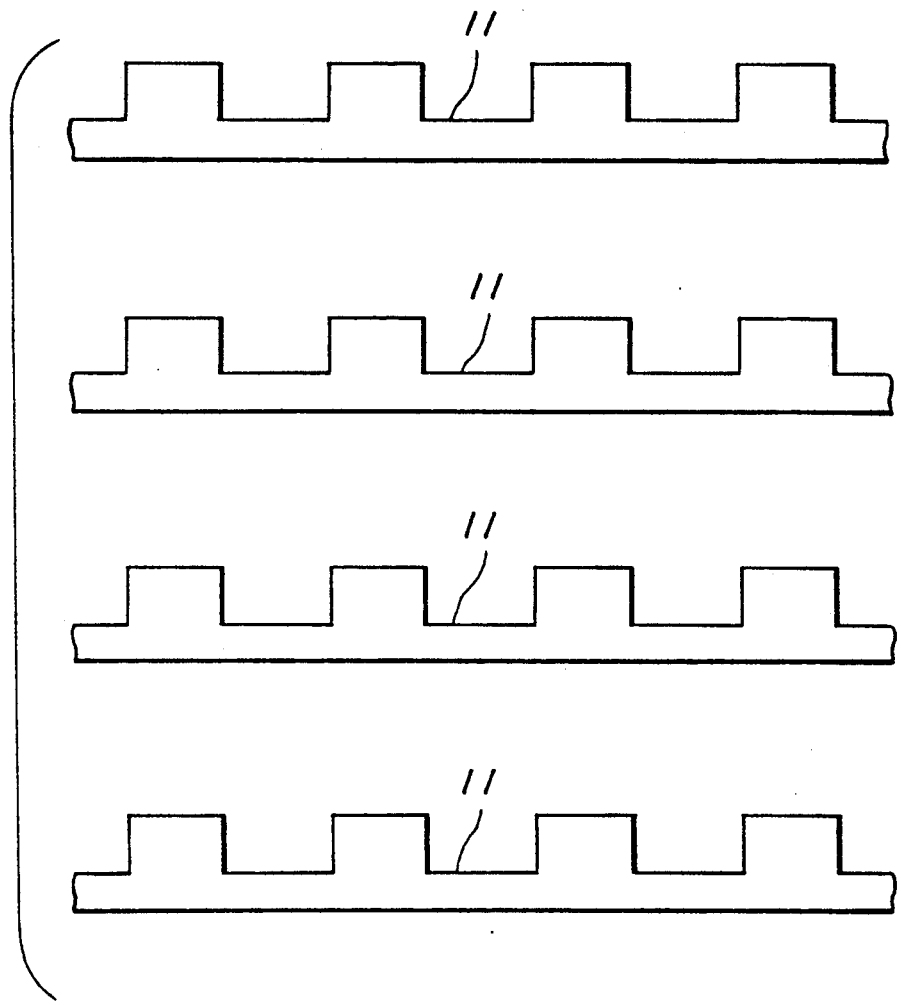
FIG. 7 is a plan view of second polysilicon electrodes used in the charge coupled device of the second embodiment.

FIGS. 5 to 8 depict the charge coupled device according to the second embodiment of the invention. Referring to FIG. 5, the charge coupled device includes first, second and third polysilicon electrodes 10, 11 and 12 extending in a horizontal transfer direction and a plurality of aluminum wiring films 13 extending in the vertical transfer direction. An insulating layer (not shown) made of silicon oxide is formed on a surface of a substrate (not shown) and fills spaces between the polysilicon electrodes 10, 11 and 12 and the aluminum wiring films 13. The first polysilicon electrodes 10 are formed on the substrate through the insulating layer and arranged apart from and adjacent to each other. As illustrated in FIG. 6, each of the first polysilicon electrodes 10 has a plurality of rectangular tooth-like branched portions extending in the vertical transfer direction from the side of a base portion thereof. As illustrated in FIG. 7, each of the second polysilicon electrodes 11 has a plurality of rectangular tooth-like branched portions extending from the side of a base portion thereof in the vertical transfer direction so as to be opposite the branched portions of the first polysilicon electrodes 10. The second polysilicon electrodes 11 are formed on the substrate such that the base portion of the electrode 11 partially extends over the base portion of the electrode 10, where the parts of both electrodes overlap each other through the insulating layer.

Figure 8:
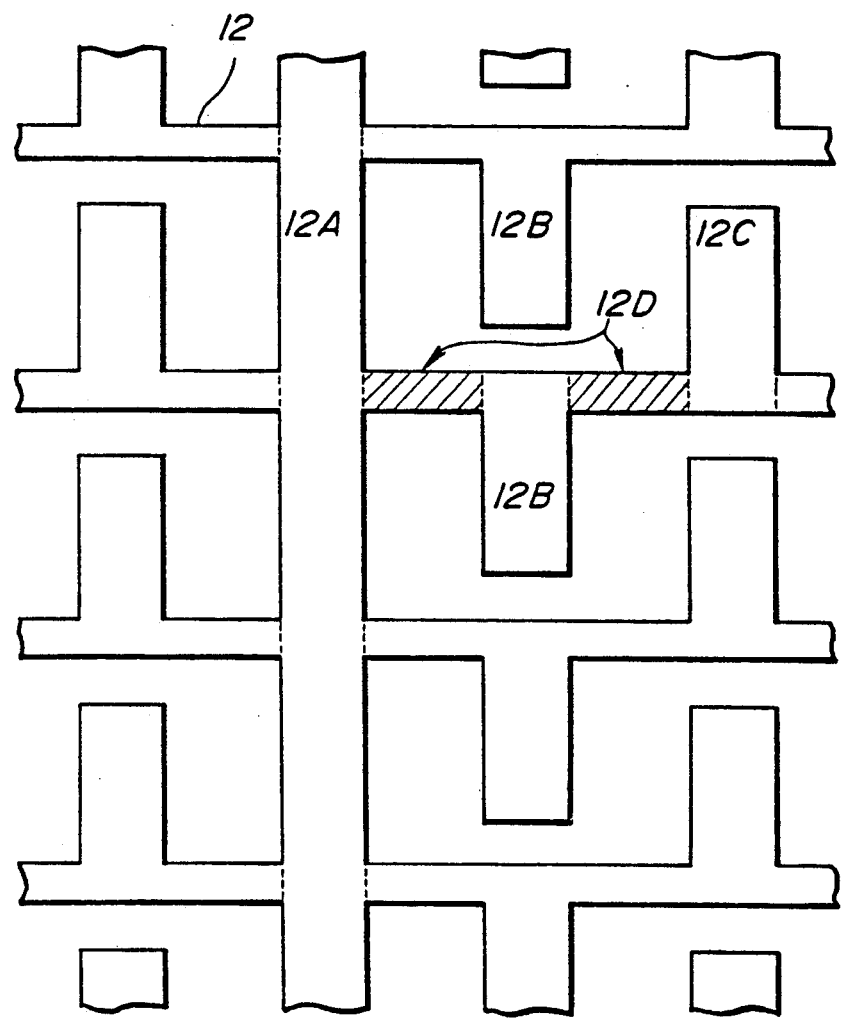
FIG. 8 is a plan view of a third polysilicon electrode used in the charge coupled device of the second embodiment.
Figure 9:
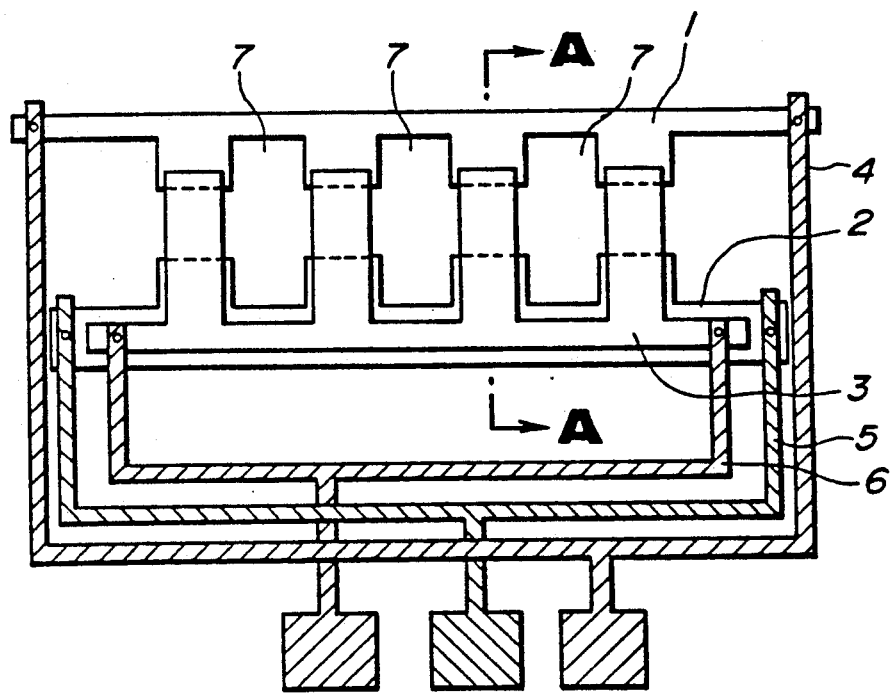
FIG. 9 is a schematic plan view of a conventional charge coupled device.
Figure 10:
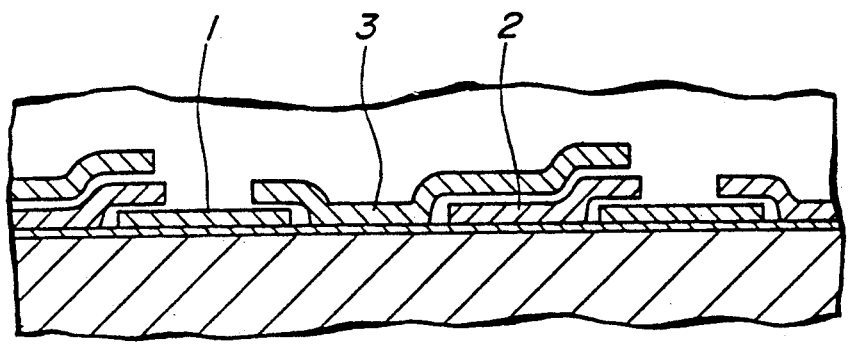
FIG. 10 is a sectional view of the conventional charge coupled device taken along line A—A of FIG. 9.

As illustrated in FIGS. 5 and 8, the third polysilicon electrode 12 has a gate portion 12A which extends in the vertical transfer direction, a base portion 12D extending in the horizontal direction and first and second branched portions 12B and 12C which extend oppositely in the vertical transfer direction from the base portion. The third polysilicon electrode 12 is formed on the surface of the substrate such that the base portion thereof overlaps the overlapping base portions of the first and second polysilicon electrodes 10 and 11 through the insulating layer. The gate portion 12A extends continuously in the vertical transfer direction traversing the respective base and branched portions of the overlapping first and second polysilicon electrodes 10 and 11. The first branched portion 12B extends from the branched portion of the first polysilicon electrode 10 toward the branched portion of the second polysilicon electrode 11. On the other hand, the second projection 12C oppositely extends from the branched portion of the second polysilicon electrode 10 toward the branched portion of the first polysilicon electrode 11.

As shown in FIG. 5, the aluminum wiring films 13 are disposed along the vertical transfer lines, traversing the base portions of the polysilicon electrodes 10, 11 and 12. Under the respective aluminum wiring films 13, the contact portions 13A, 13B and 13C, which serve for connection between the polysilicon electrodes 10, 11 and 12 and the aluminum wiring films 13, are formed through the insulating layer in the same manner as in the first embodiment of the invention mentioned above. Namely, the contact portions 13A, 13B and 13C are separately arranged in different vertical rows. Each vertically aligned row of the contact portions 13A, 13B and 13C appear under every third aluminum wiring film 13. As a result, every first and second aluminum wiring film 13 contacts the branched portions of the first and second polysilicon electrodes 10 and through the contact portions 13A and 13B. Further, every third aluminum wiring film 13 contacts the gate portion 12A through the contact portion 13C.

As is obvious from the aforementioned description of the preferred embodiments according to the present invention, a plurality of polysilicon electrodes contact a plurality of aluminum wiring films through a plurality of openings formed in an insulating layer which fills spaces between the polysilicon electrodes and the aluminum wiring films. The number of connecting portions between the polysilicon electrodes and the aluminum wiring films is larger than that of the conventional charge coupled device. Further, a distance between the connecting portions is smaller so that signal charges can be transferred at high speed. Therefore, the charge coupled device according to the invention eliminates the need to employ electrodes made of low resistivity materials and instead may realize frame interline transfer (FIT) utilizing polysilicon electrodes.

While the preferred embodiments and details have been discussed above for the purpose of illustrating the invention, it will be apparent to those skilled in the art that various changes and modifications may be made to the embodiments without departing from the spirit or scope of the invention as set forth in the following claims.

We claim as our invention:

1. A non-interlacing charge coupled device of a frame interline transfer (FIT) type comprising:
 a plurality of picture elements being aligned in the vertical direction, rows of said vertically aligned picture elements being arranged parallel and adjacent to each other;
 first, second and third polysilicon electrodes extending in the horizontal direction, each of said polysilicon electrodes being arranged on a surface of a substrate covered with an insulating layer, each of said polysilicon electrodes being used as electrodes for vertical transfer of signal charges;
 a plurality of metal wiring films extending in the vertical direction, said metal wiring films being arranged in parallel, traversing each of said polysilicon electrodes covered with the insulating layer, said metal wiring films being used as electrodes for applying a clock pulse for vertical transfer of signal charges to each of said polysilicon electrodes;
 a plurality of first openings being formed through the insulating layer such that said metal wiring films contact said first polysilicon electrodes;
 a plurality of second openings being formed through the insulating layer such that said metal wiring films contact said second polysilicon electrodes;
 a plurality of third openings being formed through the insulating layer such that said metal wiring films contact said third polysilicon electrodes wherein said third polysilicon electrodes comprise:
 a gate portion extending in the vertical direction;
 first branched portions extending along said first polysilicon electrode toward said second polysilicon electrode; and
 second branched portions extending along said second polysilicon electrode toward said first polysilicon electrode; and
 a base portion extending in the horizontal direction so that said gate portion and said first and second branched portions are connected thereto.

2. The charge coupled device according to claim 1, wherein said metal wiring films are used as a photoshield means for shielding each of said polysilicon electrodes from incident light.

3. The charge coupled device according to claim 1, wherein said third polysilicon electrodes extend across said picture elements in the horizontal direction.

4. A non-interlacing charge coupled device of a frame interline transfer (FIT) type comprising:
 a plurality of picture elements being aligned in the vertical direction, rows of said vertically aligned picture elements being arranged parallel and adjacent to each other;
 a plurality of first polysilicon electrodes extending in the horizontal direction and having a plurality of branched portions projecting perpendicularly from a base portion thereof, each of said first polysilicon electrodes being formed on a surface of a substrate through an insulating layer and being arranged apart from and parallel to each other;
 a plurality of second polysilicon electrodes extending in the horizontal direction and having a plurality of branched portions projecting perpendicularly from a base portion thereof so as to be opposed to each of the branched portion of each of said first polysilicon electrodes, each of said second polysilicon electrodes being formed on the surface of the substrate such that the base portion of each of said second polysilicon electrodes overlaps that of each of said first polysilicon electrodes through the insulating layer;
 a plurality of third polysilicon electrodes having a base portion extending in the horizontal direction, and a plurality of branched portions projecting perpendicularly from opposite sides of the base portion so that each of said third polysilicon electrodes are disposed over each of said first and second polysilicon electrodes through the insulating layer;
 a plurality of metal wiring films extending in the vertical direction, each of said metal wiring films being arranged in the horizontal direction on all of said polysilicon electrodes covered with the insulating layer, each of said metal wiring films being used as electrodes for applying a clock pulse for vertical transfer of signal charges to all of said polysilicon electrodes;
 a plurality of first openings being formed on the insulating layer such that each of said metal wiring films contact each of said first polysilicon electrodes;
 a plurality of second openings being formed on the insulating layer such that each of said metal wiring films contacts each of said second polysilicon electrodes; and
 a plurality of third openings being formed on the insulating layer such that each of said metal wiring films contacts each of said third polysilicon electrodes.

5. The charge coupled device according to claim 4, wherein each of said metal wiring films is used as a photo-shield means for shielding all of said polysilicon electrodes from incident light.

6. The charge coupled device according to claim 4, wherein each said third polysilicon electrode further comprises a gate portion extending in the vertical direction.

7. The charge coupled device according to claim 4, wherein all of said branched portions of said third polysilicon electrodes comprise first branched portions projecting from one side of the base portions and extending along each said first polysilicon electrode toward each said second polysilicon electrode, and second branched portions projecting from the other side of the base portions and extending along each said second polysilicon electrode toward each said first polysilicon electrode, said first and second branched portions being alternately arranged on the base portions.

8. A charge coupled device comprising:
a plurality of picture elements being aligned in the vertical direction, rows of said vertically aligned picture elements being arranged parallel and adjacent to each other;
first, second and third polysilicon electrodes extending in the horizontal direction, each of said polysilicon electrodes being arranged on a surface of a substrate covered with an insulating layer, each of said polysilicon electrodes being used as electrodes for vertical transfer of signal charges;
a plurality of metal wiring films extending in the vertical direction, said metal wiring files being arranged in parallel, traversing each of said polysilicon electrodes covered with the insulating layer, said metal wiring films being used as electrodes for applying a clock pulse for vertical transfer of signal charges to each of said polysilicon electrodes;
a plurality of first openings being formed through the insulating layer such that said metal wiring films contact said first polysilicon electrodes;
a plurality of second openings being formed through the insulating layer such that said metal wiring films contact said second polysilicon electrodes;
a plurality of third openings being formed through the insulating layer such that said metal wiring films contact said third polysilicon electrodes wherein said third polysilicon electrodes comprise:
a gate portion extending in the vertical direction;
first branched portions extending along said first polysilicon electrode toward said second polysilicon electrode; and
second branched portions extending along said second polysilicon electrode toward said first polysilicon electrode; and
a base portion extending in the horizontal direction so that said gate portion and said first and second branched portions are connected thereto.

9. The charge coupled device according to claim 8, wherein said metal wiring films are used as a photo-shield means for shielding each of said polysilicon electrodes from incident light.

10. The charge coupled device according to claim 8 wherein said third polysilicon electrode extend across said picture elements in the horizontal direction.

11. A charge coupled device comprising:
a plurality of picture elements being aligned in the vertical direction, rows of said vertically aligned picture elements being arranged parallel and adjacent to each other;
a plurality of first polysilicon electrodes extending in the horizontal direction and having a plurality of branched portions projecting perpendicularly from a base portion thereof, each of said first polysilicon electrodes being formed on a surface of a substrate through an insulating layer and being arranged apart from and parallel to each other;
a plurality of second polysilicon electrodes extending in the horizontal direction and having a plurality of branched portions projecting perpendicularly from a base portion thereof so as to be opposed to each of the branched portion of each of said first polysilicon electrodes, each of said second polysilicon electrodes being formed on the surface of the substrate such that the base portion of each of said second polysilicon electrodes overlaps that of each of said first polysilicon electrodes through the insulating layer;
a plurality of third polysilicon electrodes having a base portion extending in the horizontal direction, and a plurality of branched portions projecting perpendicularly from opposite sides of the base portion so that each of said third polysilicon electrodes are disposed over each of said first and second polysilicon electrodes through the insulating layer;
a plurality of metal wiring films extending in the vertical direction, each of said metal wiring films being arranged in the horizontal direction on all of said polysilicon electrodes covered with the insulating layer, each of said metal wiring films being used as electrodes for applying a clock pulse for vertical transfer of signal charges to all of said polysilicon electrodes;
a plurality of first openings being formed on the insulating layer such that said metal wiring films contacts of each said first polysilicon electrodes;
a plurality of second openings being formed on the insulating layer such that each of said metal wiring films contacts of each said second polysilicon electrodes;
a plurality of third openings being formed on the insulating layer such that said metal wiring films contacts of each said third polysilicon electrodes;

12. The charged coupled device according to claim 11, wherein each of said metal wiring films is used as a photo-shield means for shielding all of said polysilicon electrodes from incident light.

13. The charge coupled device according the claim 11, wherein each said third polysilicon electrode further comprises a gate portion extending in the vertical direction.

14. The charged coupled devices according to claim 11, wherein all of said branched portions of said third polysilicon electrodes comprise first branched portions projecting from one side of the base portions and extending along each said polysilicon electrode toward each said second polysilicon electrode, and second branched portions projecting from the other side of the base portions and extending along each said second polysilicon electrode toward each said first polysilicon electrode, said first and second branched portions being alternately arranged on the base portions.

* * * * *